US011469118B2

(12) United States Patent
Takebayashi

(10) Patent No.: US 11,469,118 B2
(45) Date of Patent: Oct. 11, 2022

(54) MEMBER FOR SEMICONDUCTOR MANUFACTURING APPARATUS

(71) Applicant: NGK INSULATORS, LTD., Nagoya (JP)

(72) Inventor: Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 117 days.

(21) Appl. No.: 16/692,120

(22) Filed: Nov. 22, 2019

(65) Prior Publication Data

US 2020/0090959 A1 Mar. 19, 2020

Related U.S. Application Data

(63) Continuation of application No. PCT/JP2018/021928, filed on Jun. 7, 2019.

(60) Provisional application No. 62/518,773, filed on Jun. 13, 2017.

(51) Int. Cl.
*H01L 21/67* (2006.01)
*H01L 21/683* (2006.01)

(52) U.S. Cl.
CPC .. *H01L 21/67069* (2013.01); *H01L 21/67248* (2013.01); *H01L 21/6833* (2013.01); *C04B 2237/343* (2013.01)

(58) Field of Classification Search
CPC ......... H01L 21/67103; H01L 21/67248; H01L 21/02; H01L 21/67069; H01L 21/6831; H01L 21/68785; H01L 21/6833; H01L 21/68757; H01L 21/67109; H05B 3/74; C04B 2237/343
See application file for complete search history.

(56) References Cited

U.S. PATENT DOCUMENTS

2005/0166848 A1 8/2005 Natsuhara et al.
2006/0279899 A1* 12/2006 Aihara ................ H01L 21/6831
361/234
2007/0144442 A1 6/2007 Migita
(Continued)

FOREIGN PATENT DOCUMENTS

JP H05-009064 A1 1/1993
JP 2003-300784 A1 10/2003
(Continued)

OTHER PUBLICATIONS

International Search Report and Written Opinion (Application No. PCT/JP2018/021928) dated Jul. 31, 2018.
(Continued)

*Primary Examiner* — Yuechuan Yu
(74) *Attorney, Agent, or Firm* — Burr & Brown, PLLC

(57) ABSTRACT

A member for a semiconductor manufacturing apparatus includes a plate, at least one through hole, and an insulating pipe (cylindrical member). The plate is formed of an alumina sintered body, has a front surface serving as a wafer placement surface, and includes therein an electrode. The through hole penetrates through the plate in a thickness direction. The insulating pipe is formed of an alumina sintered body and is joined to a rear surface of the plate with a first joining layer having a ring shape and formed of an alumina sintered body interposed between the insulating pipe and the rear surface of the plate.

13 Claims, 9 Drawing Sheets

(56) References Cited

U.S. PATENT DOCUMENTS

| | | | |
|---|---|---|---|
| 2007/0187464 A1* | 8/2007 | Routbort | ............... C04B 37/001 228/101 |
| 2011/0149462 A1 | 6/2011 | Kugimoto et al. | |
| 2011/0272899 A1 | 11/2011 | Shimazu | |
| 2013/0037532 A1 | 2/2013 | Volfovski et al. | |
| 2014/0346152 A1 | 11/2014 | Sasaki et al. | |
| 2016/0280604 A1 | 9/2016 | Nobori et al. | |
| 2018/0025933 A1 | 1/2018 | Ishimura et al. | |

FOREIGN PATENT DOCUMENTS

| | | | |
|---|---|---|---|
| JP | 2004-128232 A1 | | 4/2004 |
| JP | 2004128232 A | * | 4/2004 |
| JP | 2004288933 A | * | 10/2004 |
| JP | 2007-194616 A1 | | 8/2007 |
| JP | 2011-238682 A1 | | 11/2011 |
| JP | 3182120 U | | 3/2013 |
| JP | 2016-183067 A1 | | 10/2016 |
| KR | 10-2014-0107279 A1 | | 9/2014 |
| WO | 2016/132909 A1 | | 8/2016 |

OTHER PUBLICATIONS

Korean Office Action (Application No. 10-2019-7036081) dated Jan. 27, 2021 (with English translation).
Taiwanese Office Action (Application No. 107119965) dated Jun. 7, 2021.

* cited by examiner

MEMBER FOR SEMICONDUCTOR MANUFACTURING APPARATUS

The present application claims priority from U.S. provisional Patent Application No. 62/518,773 filed on Jun. 13, 2017, the entire contents of which are incorporated herein by reference.

BACKGROUND OF THE INVENTION

1. Field of the Invention

The present invention relates to a member for a semiconductor manufacturing apparatus.

2. Description of the Related Art

An electrostatic chuck heater is used to attract a wafer and control the temperature of the wafer in a semiconductor manufacturing process. The electrostatic chuck heater includes a plate, a plate through hole, a cooling substrate, and a cooling-substrate through hole. The plate formed of alumina includes therein an electrostatic electrode generating an electrostatic attraction force and a heater electrode generating heat. The plate through hole has a small diameter and penetrates through the plate in the thickness direction. The cooling substrate formed of metal is secured to a rear surface of the plate. The cooling-substrate through hole has a large diameter and penetrates through the cooling substrate in the thickness direction. A lift pin that moves the wafer upward/downward is inserted through the plate through hole and the cooling-substrate through hole. An insulating pipe formed of alumina is disposed in the cooling-substrate through hole for reliably providing electric insulation. For example, according to PTL 1, an insulating pipe is bonded to a cooling-substrate through hole with a resin bonding layer interposed therebetween.

CITATION LIST

Patent Literature

PTL 1: Japanese Registered Utility Model No. 3182120

SUMMARY OF THE INVENTION

However, the resin bonding layer between the insulating pipe and the cooling-substrate through hole enters a space between the insulating pipe and the plate and is exposed in the through hole. In the semiconductor manufacturing process, plasma is generated in the plate through hole or the cooling-substrate through hole in some cases. Accordingly, when the resin bonding layer is exposed in the through hole, the resin bonding layer may be lost due to the plasma, resulting in exposure of the cooling substrate in the through hole. This may lead to generation of abnormal discharge.

The present invention is made to solve the above-described problem. A main object of the present invention is to improve corrosion resistance, in a semiconductor manufacturing process, of a joined portion between a plate formed of an alumina sintered body and a cylindrical member formed of an alumina sintered body.

A member for a semiconductor manufacturing apparatus of the present invention includes:

a plate that is formed of an alumina sintered body, that has a front surface serving as a wafer placement surface, and that includes therein an electrode;

at least one through hole that penetrates through the plate in a thickness direction; and a cylindrical member that is formed of an alumina sintered body and that is joined to a rear surface of the plate with a first joining layer having a ring shape and formed of an alumina sintered body interposed between the cylindrical member and the rear surface of the plate.

In this member for a semiconductor manufacturing apparatus, the cylindrical member formed of the alumina sintered body is joined to the rear surface of the plate formed of the alumina sintered body with the first joining layer having a ring shape and formed of the alumina sintered body interposed therebetween. That is, the joining portion between the plate and the cylindrical member is formed of the alumina sintered body. Accordingly, corrosion resistance of the joining portion between the plate and the cylindrical member for an atmosphere in the semiconductor manufacturing process (for example, plasma or the like) is improved compared to the case where the joining portion includes the resin bonding layer.

In the member for a semiconductor manufacturing apparatus according to the present invention, the cylindrical member is provided for a corresponding each of the at least one through hole, and an inside of the cylindrical member communicates with the corresponding through hole. In this case, the cylindrical member and the through hole may be used as a lift-pin hole through which the lift pin that moves the wafer upward/downward is inserted or used as a gas supply hole for supplying gas to a rear surface of the wafer.

Here, it is preferable that the at least one first joining layer include a plurality of the first joining layers. It is also preferable that an inner surface of each of the plurality of through holes, a ring inner surface of a corresponding one of the plurality of first joining layers, and an inner surface of a corresponding one of the plurality of cylindrical members be continuous with one another without a step. Particularly, when using as the lift-pin hole, in the case where a step is formed between the inner surface of the through hole and the ring inner surface of the first joining layer or between the ring inner surface of the first joining layer and the inner surface of the cylindrical member, the lift pin may be caught by the step, and accordingly, the lift pin is not necessarily smoothly moved. Without such a step, the lift pin can be smoothly moved.

The member for a semiconductor manufacturing apparatus as described above may further include a cooling substrate and a plurality of cylindrical spaces. The cooling substrate is formed of metal and bonded to or joined to the rear surface of the plate. The cylindrical space penetrates through the cooling substrate in the thickness direction. In the cylindrical space, the cylindrical member is disposed. The joining portion between the plate and the cylindrical member has high corrosion resistance in the semiconductor manufacturing process. Accordingly, even when this member for a semiconductor manufacturing apparatus is used for a long time, the metal cooling substrate can be prevented from being exposed in the through hole. At this time, a gap may be formed between a wall surface surrounding each of the plurality of cylindrical spaces and an outer surface of a corresponding one of the plurality of cylindrical members. In this way, compared to the case where the wall surface surrounding the cylindrical space and the outer surface of the cylindrical member are bonded to each other, need for considering heat transfer between the cylindrical member and the cooling substrate is eliminated. This facilitates the design of temperature control for the wafer.

In the member for a semiconductor manufacturing apparatus according to the present invention, an outer diameter of the cylindrical member may be smaller than an outer diameter of the plate, and the at least one through hole may be provided in a region further to an outer circumferential side than the cylindrical member in the plate. For example, the cylindrical member may be a hollow shaft. In this case, a metal terminal electrically connected to the electrode included in the plate may be disposed in the hollow shaft. In this way, since the inside of the hollow shaft is cut off from the atmosphere of the semiconductor manufacturing process (such as plasma), the metal terminal can be protected from such an atmosphere.

In the member for a semiconductor manufacturing apparatus according to the present invention, an outer diameter of the cylindrical member may be coincident with an outer diameter of the plate, and the at least one through hole may be provided in a region further to an inner circumferential side than the cylindrical member in the plate. Here, the coincidence of the outer diameter of the cylindrical member with the outer diameter of the plate includes the case where the outer diameters of the cylindrical member and the plate are slightly different from each other (for example, within ±0.5 mm or within ±1 mm) in addition to the case where the outer diameters of the both are exactly the same.

The member for a semiconductor manufacturing apparatus as described above may include a stepped cooling substrate that is formed of metal and that has lamination shape formed of a small plate portion having an outer diameter smaller than an inner diameter of the cylindrical member and a large plate portion having an outer diameter larger than the outer diameter of the cylindrical member. The rear surface of the plate may be bonded to or joined to a front surface of the small plate portion of the cooling substrate, and a rear surface of the cylindrical member may be bonded to a step surface of the cooling substrate or spaced from the step surface of the cooling substrate with a gap between the rear surface of the cylindrical member and the step surface of the cooling substrate. When the rear surface of the cylindrical member and the step surface of the cooling substrate are bonded to each other, a route through which the atmosphere of the semiconductor manufacturing process unintentionally flows to a bonded portion or a joined portion between the rear surface of the plate and the small plate portion of the cooling substrate is blocked. This improves the durability of the bonded portion or the joined portion. Even when a gap is formed due to degradation and loss of a bonded portion between the rear surface of the cylindrical member and the step surface of the cooling substrate caused by use of the member for a semiconductor manufacturing apparatus for a long time, variation of the amount of heat lost in this portion over time is small because the cylindrical member is joined to the plate with the first joining layer interposed therebetween. Furthermore, the original performance can be obtained by refilling the gap with resin. Meanwhile, when the gap is formed between the rear surface of the cylindrical member and the step surface of the cooling substrate, since the cylindrical member functions as a wall surrounding an outer circumference of the plate, the likelihood of unintentional flowing of the atmosphere of the semiconductor manufacturing process to the bonded portion or the joined portion between the rear surface of the plate and the small plate portion of the cooling substrate is reduced. This improves the durability of the bonded portion or the joined portion.

The member for a semiconductor manufacturing apparatus including the stepped cooling substrate as described above may further include a insulating pipe and a cylindrical space. The insulating pipe is formed of an alumina sintered body, is provided for a corresponding each of the at least one through hole, and is joined to the rear surface of the plate, such that the insulating pipe communicates with the corresponding the through hole, with a second joining layers having a ring shape and formed of an alumina sintered body interposed between the insulating pipe and the rear surface of the plate. The p cylindrical space penetrates through the cooling substrate in the thickness direction. In the cylindrical space, the insulating pipe is disposed. In this way, since a joining portion between the plate and the insulating pipe is the alumina sintered body, corrosion resistance of the joining portion between the plate and the insulating pipe for the atmosphere in the semiconductor manufacturing process (for example, plasma or the like) is improved compared to the case where the joining portion includes a resin bonding layer. In this case, the insulating pipe and the through hole may be used as the lift-pin hole through which the lift pin that moves the wafer upward/downward is inserted or used as the gas supply hole for supplying the gas to the rear surface of the wafer.

At this time, a gap may be formed between a wall surface surrounding the cylindrical space and an outer surface of the insulating pipe. In this way, compared to the case where the wall surface surrounding the cylindrical space and the outer surface of the insulating pipe are bonded to each other, need for considering heat transfer between the insulating pipe and the cooling substrate is eliminated. This facilitates the design of temperature control for the wafer.

Furthermore, it is preferable that a wall surface of the through hole, a ring inner surface of the second joining layer, and an inner surface of the insulating pipe be continuous with one another without a step. Particularly, when the insulating pipe and the through hole are used as the lift-pin hole, in the case where a step is formed between the wall surface surrounding the through hole and the ring inner surface of the second joining layer or between the ring inner surface of the second joining layer and the inner surface of the insulating pipe, the lift pin may be caught by the step, and accordingly, the lift pin is not necessarily smoothly moved. Without such a step, the lift pin can be smoothly moved.

In the member for a semiconductor manufacturing apparatus according to the present invention, an interface between the plate and the first joining layer and an interface between the cylindrical member and the first joining layer may contain $MgF_2$. When the plate and the cylindrical member are joined to each other by using an alumina-containing joining material containing $MgF_2$, the plate and the cylindrical member can be joined without largely increasing the pressure or the temperature because $MgF_2$ acts as a sintering agent for alumina. Furthermore, since the volume resistivity and the withstand voltage of the $MgF_2$ are less likely to reduce than those of another sintering agent (for example, CaO or the like), $MgF_2$ is preferred. Meanwhile, interface between the plate and the second joining layer and an interface between the insulating pipe and the second joining layer may contain $MgF_2$. Also in this case, when the plate and the insulating pipe are joined to each other by using an alumina-containing joining material containing $MgF_2$, the plate and the insulating pipe can be joined without largely increasing the pressure or the temperature.

In the member for a semiconductor manufacturing apparatus according to the present invention, the plate may be an electrostatic chuck heater, an electrostatic chuck, or a ceramic heater.

DETAILED DESCRIPTION OF THE INVENTION

First Embodiment

Figure 1:
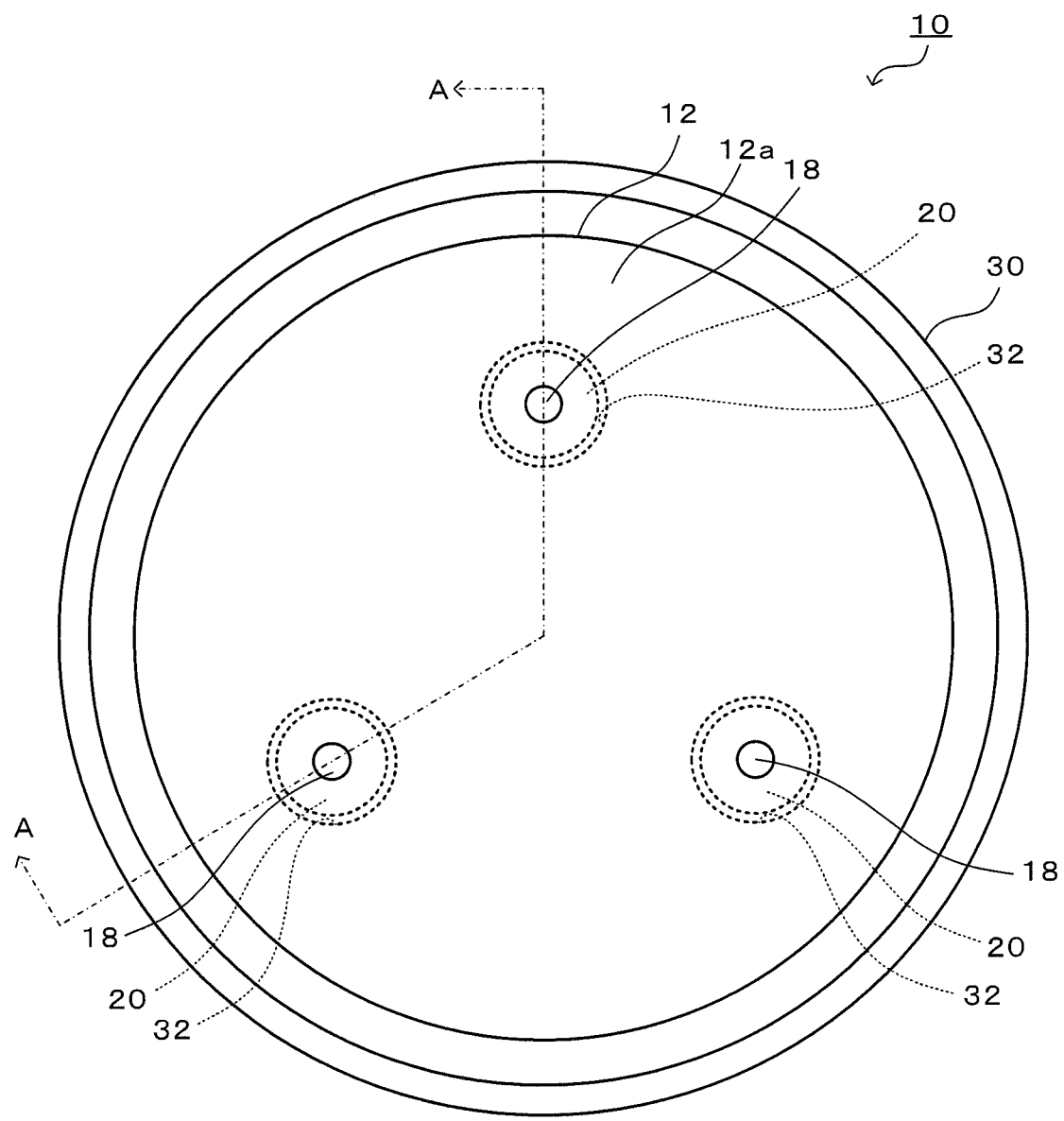
FIG. 1 is a plan view of a member for a semiconductor manufacturing apparatus 10.
Figure 2:
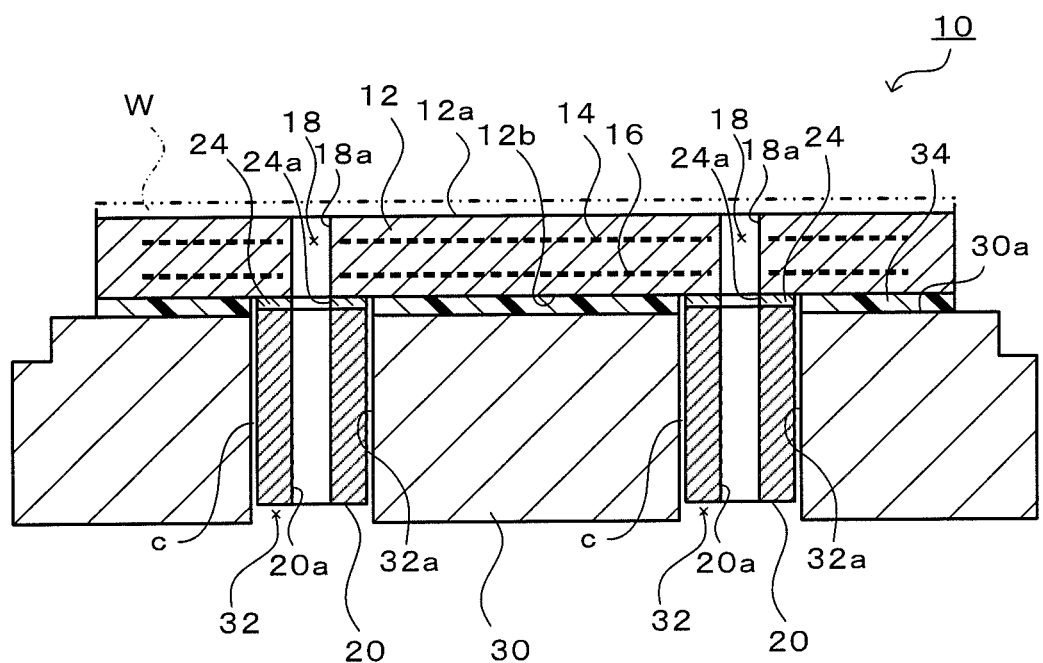
FIG. 2 is a sectional view of FIG. 1 taken along line A-A.

FIG. 1 is a plan view of a member for a semiconductor manufacturing apparatus 10, and FIG. 2 is a sectional view of FIG. 1 taken along line A-A. The member for a semiconductor manufacturing apparatus 10 includes a plate 12, insulating pipes 20 serving as cylindrical members, and a cooling substrate 30.

The plate 12 is a circular plate (for example, having a diameter of 300 mm) formed of an alumina sintered body. A front surface of the plate 12 serves as a wafer placement surface 12a. The plate 12 includes an electrostatic electrode 14 and a heater electrode 16 therein. The plate 12 has a plurality of (herein, three of) through holes 18 penetrating through the plate 12 in the thickness direction. The electrostatic electrode 14 is a planar electrode. A direct-current voltage is applied to the electrostatic electrode 14 through a power feeding rod (not illustrated). When the direct-current voltage is applied to the electrostatic electrode 14, a wafer W is firmly attracted to the wafer placement surface 12a by an electrostatic attraction force. When the application of the direct-current voltage is stopped, the firm attraction of the wafer W to the wafer placement surface 12a is released. The heater electrode 16 is formed by a heater wire routed in a unicursal manner from one terminal to the other terminal of the heater wire throughout the wafer placement surface 12a. The power is supplied to the heater electrode 16 through a power feeding rod (not illustrated). Neither the electrostatic electrode 14 nor the heater electrode 16 is exposed in the through holes 18. The plate 12 as described above is referred to as an electrostatic chuck heater.

The insulating pipes 20 are pipes (for example, having an outer diameter of 4 to 10 mm, an inner diameter of 0.5 to 4 mm, and a length of 20 to 50 mm) formed of an alumina sintered body and provided for the respective through holes 18. The insulating pipes 20 are joined to a rear surface 12b of the plate 12 with respective first joining layers 24 formed of an alumina sintered body interposed therebetween. The first joining layers 24 are ring-shaped layers. The insulating pipes 20 and the respective through holes 18 of the plate 12 communicate with one another. The insulating pipes 20 and the through holes 18 of the plate 12 are used as lift-pin holes or gas supply holes. The wafer W placed on the wafer placement surface 12a is pushed upward by lift pins inserted through the lift-pin holes. Gas is supplied to a rear surface of the wafer W through the gas supply holes. According to the present embodiment, the insulating pipes 20 and the through holes 18 of the plate 12 are used as the lift-pin holes. An inner surface 18a of each of the through holes 18, a ring inner surface 24a of a corresponding one of the first joining layers 24, and an inner surface 20a of a corresponding one of the insulating pipes 20 are continuous with one another without a step.

The cooling substrate 30 is a circular plate (having a diameter larger than or the same as the diameter of the plate) formed of metal aluminum or an aluminum alloy. Although it is not illustrated, a coolant path through which coolant circulates is formed in the cooling substrate 30. The cooling substrate 30 has a plurality of cylindrical spaces 32 penetrating therethrough in the thickness direction. The insulating pipes 20 are disposed in the cylindrical spaces 32. The diameter of the cylindrical spaces 32 is slightly larger than the diameter of the insulating pipes 20 (for example, by 0.5 mm or 1 mm). Thus, a gap c is formed between a wall surface 32a surrounding each of the cylindrical spaces 32 and an outer surface of a corresponding one of the insulating pipes 20. A front surface 30a of the cooling substrate 30 is bonded to the rear surface 12b of the plate 12 with a plate-shaped resin bonding layer 34 interposed therebetween. The plate-shaped resin bonding layer 34 has holes (the diameter of the holes is slightly larger than the diameter of the insulating pipes 20) through which the insulating pipe 20 is inserted. Alternatively, the front surface 30a of the cooling substrate 30 may be joined to the rear surface 12b of the plate 12 with a blazing alloy layer interposed therebetween.

Next, an example of use of the member for a semiconductor manufacturing apparatus 10 structured as above is described. First, the wafer W is placed on the wafer placement surface 12a with the member for a semiconductor manufacturing apparatus 10 installed in a chamber (not illustrated). Then, the pressure in the chamber is reduced by a vacuum pump so as to adjust the pressure to a predetermined degree of vacuum, and the direct-current voltage is applied to the electrostatic electrode 14 of the plate 12. Thus, the electrostatic attraction force is generated, thereby firmly attracting the wafer W to the wafer placement surface 12a. Next, the inside of the chamber is set to be an atmosphere of a reactant gas of a predetermined pressure (for example, some tens to some hundreds Pa). In this state, a high-frequency voltage is applied across an upper electrode (not illustrated) provided at a top portion of the chamber and the electrostatic electrode 14 of the member for a semiconductor manufacturing apparatus 10, thereby generating plasma. The high-frequency voltage may be applied across the upper electrode and the cooling substrate 30 instead of across the upper electrode and the electrostatic electrode 14. A front surface of the wafer W is etched by the generated plasma. The coolant circulates through the coolant path (not illustrated) of the cooling substrate 30. The power is supplied to the heater electrode 16 such that the temperature of the wafer W is a preset target temperature.

Figure 3A:
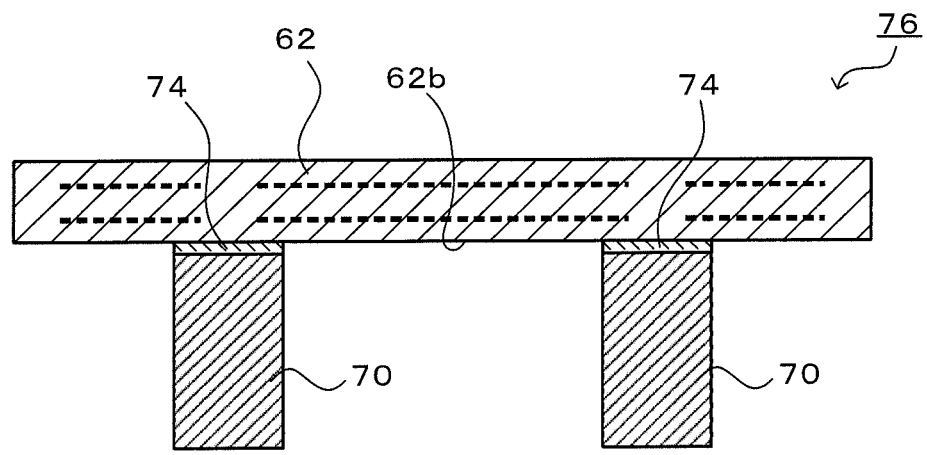
FIGS. 3A and 3B illustrate steps of the manufacture of the member for a semiconductor manufacturing apparatus 10.
Figure 3B:
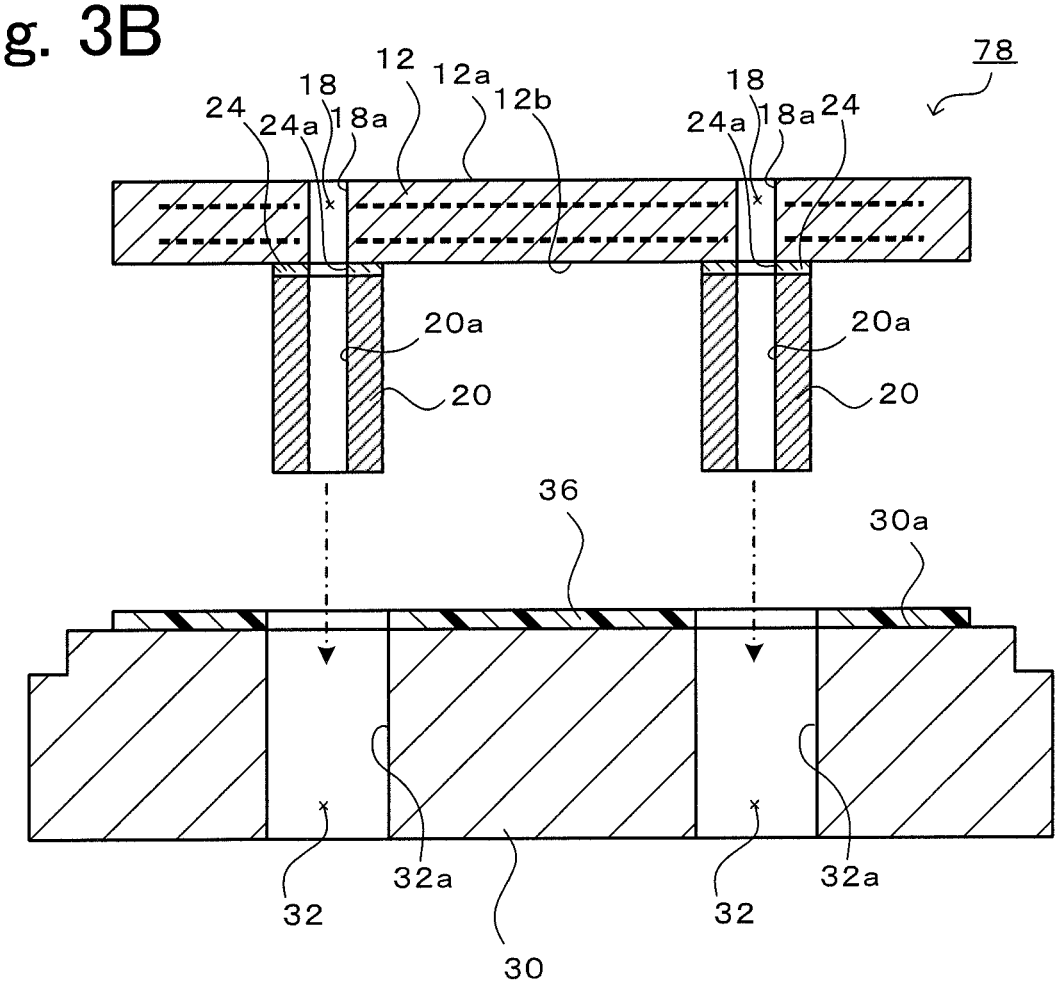

Next, an example of the manufacture of the member for a semiconductor manufacturing apparatus 10 is described. FIGS. 3A and 3B illustrate steps of the manufacture of the member for a semiconductor manufacturing apparatus 10. First, a plate 62 is prepared. The plate 62 is the same as the plate 12 other than that the plate 62 does not have the through holes 18. A joining-material paste containing alumina powder, a sintering agent, and a solvent is applied to positions (herein, three positions) in a rear surface 62b of the plate 62 where the through holes 18 are to be formed.

Examples of the sintering agent include, for example, magnesium fluoride, calcium oxide, silicon oxide, magnesium nitrate, titanium oxide, and so forth. Examples of the solvent include, for example, methanol, ethanol, and so forth. End surfaces of insulating columns 70 are superposed on the joining-material paste. The insulating columns 70 are finally to become the insulating pipes 20. Then, the plate 62 and the insulating columns 70 are heated while pressure is applied to the plate 62 and the insulating columns 70, thereby the joining material is sintered. Thus, the plate 62 and the insulating columns 70 are joined to one another. The joining material having been sintered becomes a joining layers 74. At this time, since the joining material contains the sintering agent, the joining can be achieved without largely increasing the pressure or the temperature. Thus, an assembly 76 in which the plurality of insulating columns 70 are joined to the rear surface 62b of the plate 62 with the joining layers 74 formed of an alumina sintered body and having a circular plate shape interposed therebetween is obtained(see FIG. 3A). A sintering agent component is contained in interfaces between the plate 62 and the joining layers 74 and interfaces between the insulating columns 70 and the joining layers 74. When considering maintaining of a high volume resistivity and a high withstand voltage of the alumina sintered body, it is preferable that the sintering agent be magnesium fluoride.

Next, holes are made by using a drilling tool such as a drill such that the holes penetrate through the plate 62, the joining layers 74, and the insulating columns 70. Thus, an assembly 78 is obtained (see FIG. 3B). The plate 62 becomes the plate 12 having the plurality of through holes 18. The insulating columns 70 become, when the holes are made in the axial direction, the insulating pipes 20. The joining layers 74 becomes, when the holes are made at the centers thereof, the first joining layers 24. The inner surface 18a of each of the through holes 18, the ring inner surface 24a of a corresponding one of the first joining layers 24, and the inner surface 20a of a corresponding one of the insulating pipes 20 are continuous with one another without a step by using the drilling tool.

Next, the cooling substrate 30 having the cylindrical spaces 32 is prepared (see FIG. 3B). A resin bonding agent 36 is applied to at least one of the front surface 30a of the cooling substrate 30 and the rear surface 12b of the plate 12 of the assembly 78 (herein, the front surface 30a), and then, the front surface 30a and the rear surface 12b are aligned and bonded to each other. At this time, the gap c is formed between each of the wall surfaces 32a surrounding a corresponding one of the cylindrical spaces 32 and the outer surface of a corresponding one of the insulating pipes 20. Thus, the member for a semiconductor manufacturing apparatus 10 is obtained. Alternatively, the front surface 30a of the cooling substrate 30 may be joined to the rear surface 12b of the plate 12 by a blazing alloy instead of being bonded by the resin bonding agent 36.

In the member for a semiconductor manufacturing apparatus 10 having been described in detail, the insulating pipes 20 formed of the alumina sintered body are joined to the rear surface 12b of the plate 12 formed of the alumina sintered body with the first joining layers 24 having a ring shape and formed of the alumina sintered body interposed therebetween. That is, joining portions between the plate 12 and the insulating pipes 20 are the alumina sintered body. Accordingly, corrosion resistance of the joining portions between the plate 12 and the insulating pipes 20 for an atmosphere in a semiconductor manufacturing process (for example, plasma or the like) is improved compared to the case where the joining portions include a resin bonding layer.

Furthermore, each of the insulating pipes 20 is provided for a corresponding one of the through holes 18, and the inside of the insulating pipe 20 communicates with the through hole 18. Thus, the insulating pipes 20 and the through holes 18 can be used as the lift-pin holes or the gas supply holes. Here, the inner surface 18a of each of the through holes 18, the ring inner surface 24a of a corresponding one of the first joining layers 24, and the inner surface 20a of a corresponding one of the insulating pipes 20 are continuous with one another without a step. When the insulating pipe 20 and the through hole 18 are used as a lift-pin hole, in the case where a step is formed between the inner surface 18a of the through hole 18 and the ring inner surface 24a of the first joining layer 24 or between the ring inner surface 24a of the first joining layer 24 and the inner surface 20a of the insulating pipe 20, the lift pin may be caught by the step, and accordingly, the lift pin is not necessarily smoothly moved. Here, such a step is not formed, and the lift pin can be smoothly moved.

Furthermore, the member for a semiconductor manufacturing apparatus 10 includes the metal cooling substrate 30 bonded to the rear surface 12b of the plate 12 and the cylindrical spaces 32 penetrating through the cooling substrate 30 in the thickness direction. The insulating pipes 20 are disposed in the cylindrical spaces 32. As described above, the joining portions between the plate 12 and the insulating pipes 20 have high corrosion resistance in the semiconductor manufacturing process. Accordingly, even when the member for a semiconductor manufacturing apparatus 10 is used for a long time, the metal cooling substrate 30 can be prevented from being exposed in the through holes 18. Thus, abnormal discharge can be prevented.

Furthermore, the gap c is formed between each of the wall surfaces 32a surrounding a corresponding one of the cylindrical spaces 32 and the outer surface of a corresponding one of the insulating pipes 20. Thus, compared to the case where the wall surface 32a and the outer surface of the insulating pipe 20 are bonded to each other, need for considering heat transfer between the insulating pipe 20 and the cooling substrate 30 is eliminated. This facilitates the design of temperature control for the wafer W.

Furthermore, the plate 12 and the insulating pipes 20 are joined to one another by using the joining-material paste containing the alumina powder and the sintering agent. Thus, the plate 12 and the insulating pipes 20 can be joined without largely increasing the pressure or the temperature. Furthermore, the sintering agent is contained in the interfaces between the plate 12 and the first joining layers 24 and the interfaces between the insulating pipes 20 and the first joining layers 24. Preferably, the sintering agent is magnesium fluoride ($MgF_2$). The reason for this is that the volume resistivity and the withstand voltage of $MgF_2$ are less likely to reduce than those of another sintering agent (for example, Cao or the like).

Second Embodiment

Figure 4:
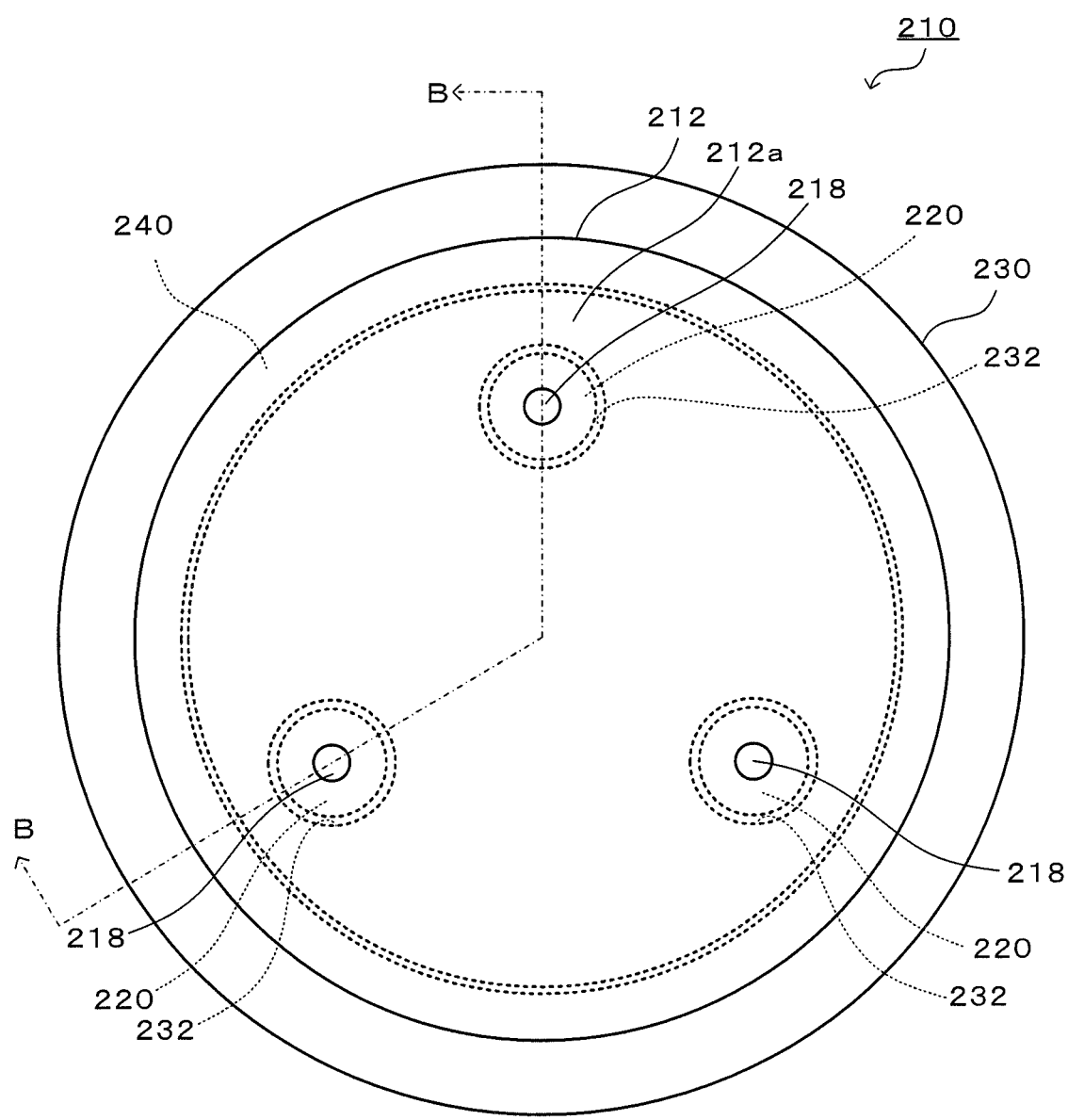
FIG. 4 is a plan view of a member for a semiconductor manufacturing apparatus 210.
Figure 5:
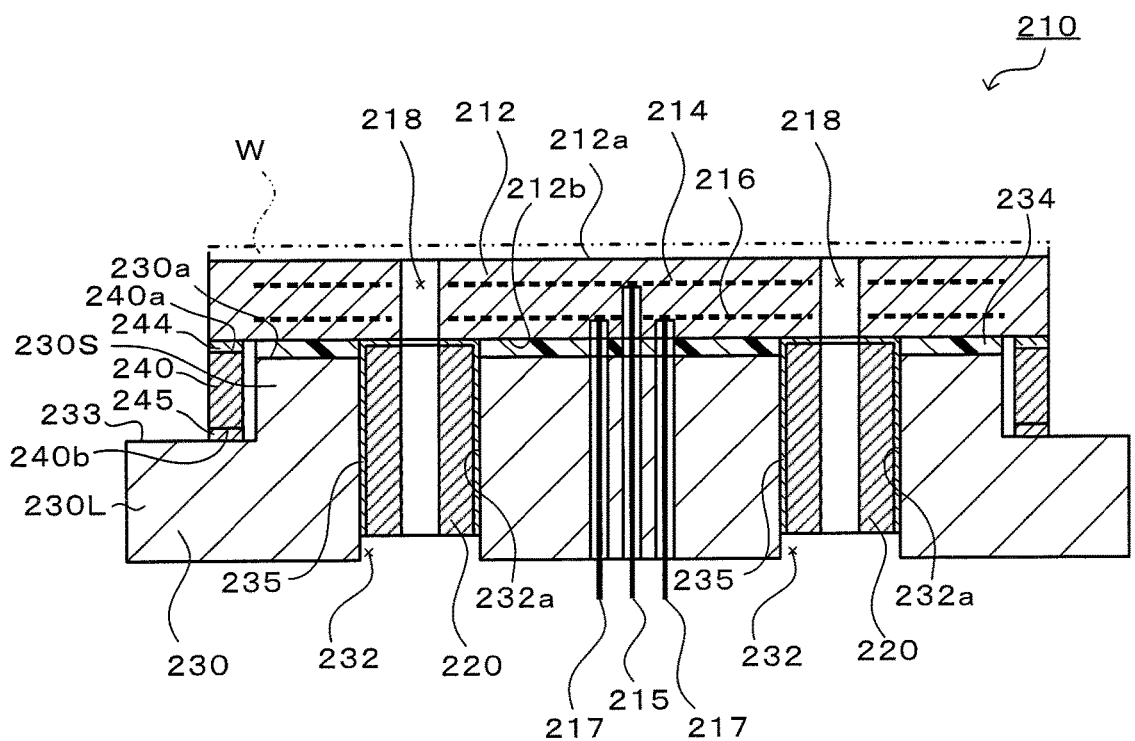
FIG. 5 is a sectional view of FIG. 4 taken along line B-B.

FIG. 4 is a plan view of a member for a semiconductor manufacturing apparatus 210, and FIG. 5 is a sectional view of FIG. 4 taken along line B-B. The member for a semiconductor manufacturing apparatus 210 includes a plate 212, an insulating ring 240 serving as a cylindrical member, insulating pipes 220, and a cooling substrate 230.

The plate 212 is a circular plate (for example, having a diameter of 300 mm) formed of an alumina sintered body. A front surface of the plate 212 serves as a wafer placement surface 212a. The plate 212 includes an electrostatic electrode 214 and a heater electrode 216 therein. The plate 212 has a plurality of through holes 218 penetrating through the plate 212 in the thickness direction. Since the electrostatic electrode 214 and the heater electrode 216 are the same as the electrostatic electrode 14 and the heater electrode 16 according to the first embodiment, description of the electrostatic electrode 214 and the heater electrode 216 is omitted herein.

The insulating ring 240 is a ring (for example, having an outer diameter of 300 mm, an inner diameter of 298 mm, and a height of 8 mm) formed of an alumina sintered body. The outer diameter of the insulating ring 240 is coincident with the diameter of the plate 212. The coincidence of the outer diameter of the insulating ring 240 with the outer diameter of the plate 212 includes the case where the outer diameters of the insulating ring 240 and the plate 212 are slightly different from each other (for example, within ±0.5 mm or within ±1 mm) in addition to the case where the outer diameters of the both are exactly the same. When the member for a semiconductor manufacturing apparatus 210 is seen in plan view, an outer circumference of the insulating ring 240 is superposed on an outer circumference of the plate 212. A front surface 240a of the insulating ring 240 is joined to a rear surface 212b of the plate 212 with a first joining layer 244 formed of an alumina sintered body interposed therebetween. The first joining layer 244 has a ring shape. All of the plurality of through holes 218 are provided in a region further to an inner circumferential side than the insulating ring 240 in the plate 212. The through holes 218 are used as the lift-pin holes or the gas supply holes. A metal terminal 215 for supplying the power to the electrostatic electrode 214 and a pair of metal terminals 217 for supplying the power to the heater electrode 216 are disposed in the insulating ring 240.

The cooling substrate 230 is a circular plate formed of metal aluminum or an aluminum alloy. The cooling substrate 230 has a multilayer shape in which a small circular plate portion 230S is stacked on a large circular plate portion 230L in the up-down direction. The cooling substrate 230 has a step surface 233 at an outer peripheral portion thereof. The central axis of the small circular plate portion 230S is coincident with the central axis of the large circular plate portion 230L. An outer diameter of the small circular plate portion 230S is smaller than the inner diameter of the insulating ring 240, and an outer diameter of the large circular plate portion 230L is larger than the outer diameter of the insulating ring 240. The small circular plate portion 230S is disposed inside the insulating ring 240. The rear surface 212b of the plate 212 is bonded to a front surface of the small circular plate portion 230S with a plate-shaped resin bonding layer 234 interposed therebetween. The joining may be achieved with a blazing joining layer instead of the plate-shaped resin bonding layer 234 interposed therebetween. A rear surface 240b of the insulating ring 240 is bonded to the step surface 233 of the cooling substrate 230 (a front surface of the large circular plate portion 230L) with a ring-shaped resin bonding layer 245 interposed therebetween. Although it is not illustrated, a coolant path through which the coolant circulates is formed in the cooling substrate 230. The cooling substrate 230 has a plurality of cylindrical spaces 232 penetrating therethrough in the thickness direction. The insulating pipes 220 are disposed in the cylindrical spaces 232. The cooling substrate 230 has insertion holes through which the metal terminals 215, 217 are inserted in the up-down direction.

The insulating pipes 220 are the same as the insulating pipes 20 according to the first embodiment, and the through holes 218 are each provided for a corresponding one of the insulating pipes 220. Each of the insulating pipes 220 is bonded to the rear surface 212b of the plate 212 with a corresponding one of cylindrical resin bonding layers 235 interposed therebetween and bonded to a wall surface 232a surrounding a corresponding one of the cylindrical spaces 232 of the cooling substrate 230 with a corresponding one of the cylindrical resin bonding layers 235 interposed therebetween. The insulating pipes 220 and the respective through holes 218 of the plate 212 communicate with one another. The insulating pipes 220 and the through holes 218 of the plate 212 are used as the lift-pin holes or the gas supply holes. Here, it is assumed that the insulating pipes 220 and the through holes 18 are used as the lift-pin holes.

Next, an example of use of the member for a semiconductor manufacturing apparatus 210 structured as above is described. First, the wafer W is placed on the wafer placement surface 212a with the member for a semiconductor manufacturing apparatus 210 installed in a chamber (not illustrated). Then, the pressure in the chamber is reduced by a vacuum pump so as to adjust the pressure to a predetermined degree of vacuum, and the direct-current voltage is applied to the electrostatic electrode 214 of the plate 212. Thus, the electrostatic attraction force is generated, thereby firmly attracting the wafer W to the wafer placement surface 212a. Next, the inside of the chamber is set to be an atmosphere of a reactant gas of a predetermined pressure (for example, some tens to some hundreds Pa). In this state, a high-frequency voltage is applied across an upper electrode (not illustrated) provided at a top portion of the chamber and the electrostatic electrode 214 of the member for a semiconductor manufacturing apparatus 210, thereby generating plasma. The high-frequency voltage may be applied across the upper electrode and the cooling substrate 230 instead of across the upper electrode and the electrostatic electrode 214. The front surface of the wafer W is etched by the generated plasma. The coolant circulates through the coolant path (not illustrated) of the cooling substrate 230. The power is supplied to the heater electrodes 216 such that the temperature of the wafer W is a preset target temperature.

A route through which the atmosphere of the semiconductor manufacturing process unintentionally flows from the outside to the plate-shaped resin bonding layer 234, which is a bonding portion between the rear surface 212b of the plate 212 and the small circular plate portion 230S of the cooling substrate 230, is blocked. This improves the durability of the plate-shaped resin bonding layer 234. Furthermore, even when the ring-shaped resin bonding layer 245 is degraded and lost due to use of the member for a semiconductor manufacturing apparatus 210 for a long time, the likelihood of unintentional flowing of the atmosphere of the semiconductor manufacturing process from the outside to the plate-shaped resin bonding layer 234 is reduced by the insulating ring 240 functioning as a wall. Thus, the plate-shaped resin bonding layer 234 is protected. Furthermore, even when the plate-shaped resin bonding layer 234 is lost, variation of the amount of heat lost in this portion over time is small due to the presence of the insulating ring 240. Furthermore, the original performance can be obtained by refilling the degraded and lost portion with the resin bonding agent.

Figure 6A:
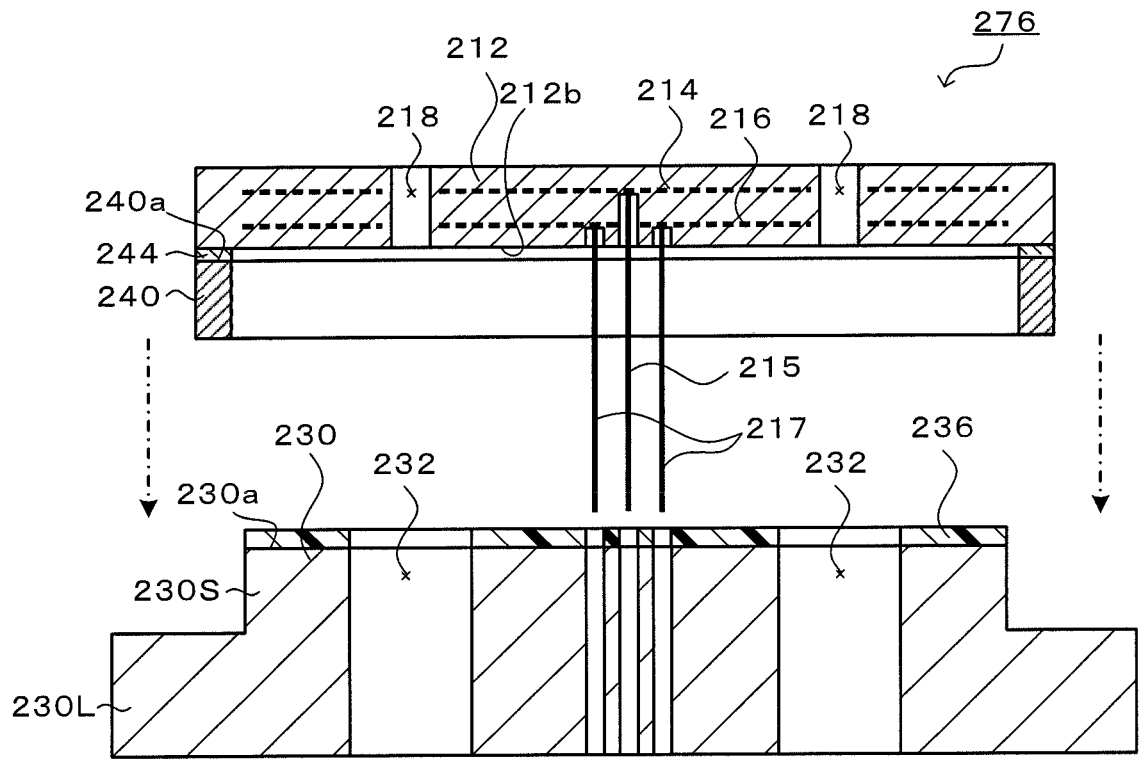
FIGS. 6A and 6B illustrate steps of the manufacture of the member for a semiconductor manufacturing apparatus 210.
Figure 6B:
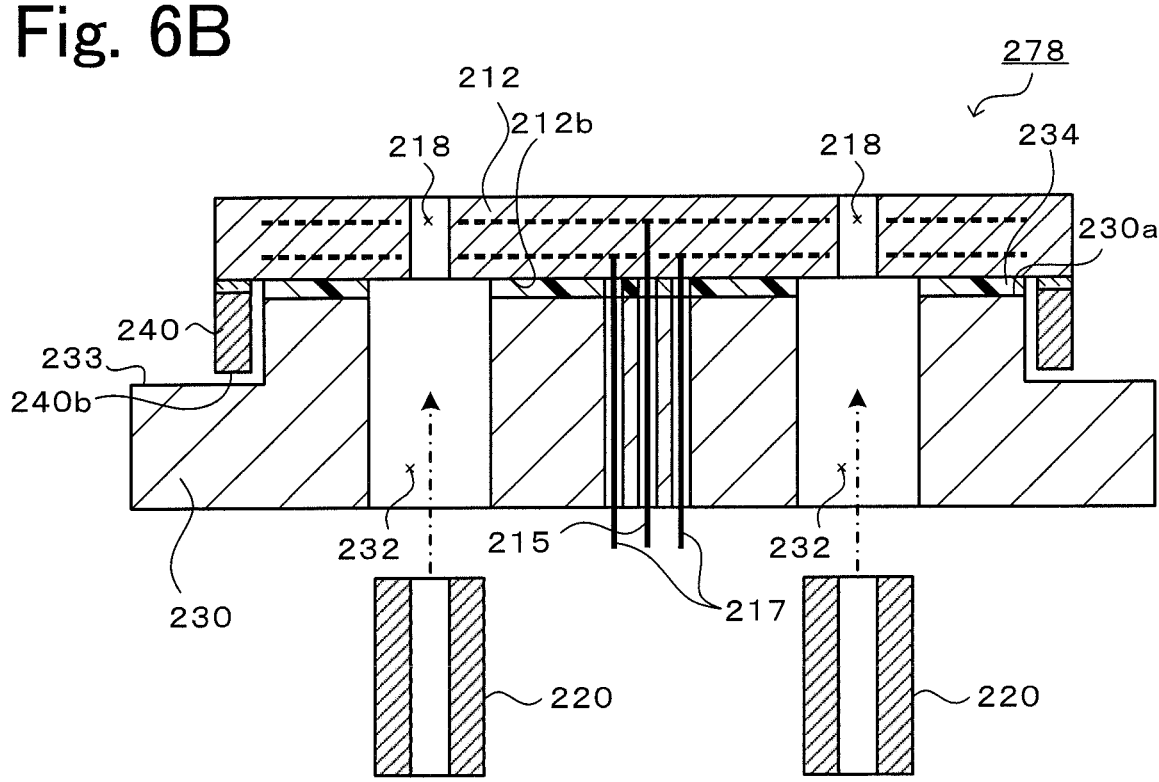

Next, an example of the manufacture of the member for a semiconductor manufacturing apparatus 210 is described. FIGS. 6A and 6B illustrate steps of the manufacture of the member for a semiconductor manufacturing apparatus 210. First, the plate 212 and the insulating ring 240 are prepared. The plate 212 has the through holes 218. In addition, part of the electrostatic electrode 214 and parts of the heater electrodes 216 are exposed from the rear surface 212b of the plate 212. Next, the joining-material paste similar to that according to the first embodiment is applied to the front surface 240a of the insulating ring 240. Then, the plate 212 is placed on the front surface 240a of the insulating ring 240, and the insulating ring 240 and the plate 212 are heated while pressure is applied to the insulating ring 240 and the plate 212, thereby the joining material is sintered. Thus, the insulating ring 240 and the plate 212 are joined to each other. The joining material having been sintered serves as the first joining layers 244. At this time, since the joining-material paste contains the sintering agent (for example, $MgF_2$), the joining can be achieved without largely increasing the pressure or the temperature. A sintering agent component is contained in an interface between the plate 212 and the first joining layer 244 and an interface between the insulating ring 240 and the first joining layer 244. Next, the metal terminal 215 for supplying the power to the electrostatic electrode 214 is attached to the electrostatic electrode 214 from the rear surface 212b of the plate 212, and the metal terminals 217 for supplying the power to the heater electrode 216 are attached to the heater electrode 216 from the rear surface 212b of the plate 212. Thus, an assembly 276 in which the insulating ring 240 is joined to the rear surface 212b of the plate 212 with the first joining layer 244 having a ring shape and formed of the alumina sintered body interposed therebetween is obtained (see FIG. 6A).

Next, the cooling substrate 230 is prepared (see FIG. 6A). The cooling substrate 230 includes the small circular plate portion 230S and the large circular plate portion 230L and has the cylindrical spaces 232 and the insertion holes for the metal terminals 215, 217. A resin bonding agent 236 is applied to at least one of a front surface 230a of the cooling substrate 230 and the rear surface 212b of the plate 212 of the assembly 276, and then, the front surface 230a and the rear surface 212b are aligned and bonded to each other. At this time, the front surface 230a and the rear surface 212b are bonded while being arranged such that the cylindrical spaces 232 face the through holes 218 and the metal terminals 215, 217 are inserted through the insertion holes. Thus, an assembly 278 in which the cooling substrate 230 is bonded to the rear surface 212b of the plate 212 with the plate-shaped resin bonding layer 234 interposed therebetween is obtained (see FIG. 6B). The rear surface 240b of the insulating ring 240 is arranged with a gap formed between the rear surface 240b and the step surface 233 of the cooling substrate 230. Alternatively, the cooling substrate 230 may be joined to the plate 212 by a blazing alloy instead of being bonded by the resin bonding agent.

Next, the insulating pipes 220 are prepared (see FIG. 6B). A resin bonding agent is applied to upper end surfaces and side surfaces of the insulating pipes 220, the insulating pipes 220 are inserted into the cylindrical spaces 232 of the cooling substrate 230, and the resin bonding agent is set. The set resin bonding agent becomes the cylindrical resin bonding layers 235 (see FIG. 5). Furthermore, the gap between the rear surface 240b of the insulating ring 240 and the step surface 233 of the cooling substrate 230 is filled with a resin bonding agent so as to form the ring-shaped resin bonding layer 245 (see FIG. 5). Thus, the member for a semiconductor manufacturing apparatus 210 is obtained.

In the member for a semiconductor manufacturing apparatus 210 having been described in detail, the insulating ring 240 formed of the alumina sintered body is joined to the rear surface 212b of the plate 212 formed of the alumina sintered body with the first joining layer 244 having a ring shape and formed of the alumina sintered body interposed therebetween. That is, a joining portion between the plate 212 and the insulating ring 240 is the alumina sintered body. Accordingly, corrosion resistance of the joining portion between the plate 212 and the insulating ring 240 for the atmosphere of the semiconductor manufacturing process (for example, plasma or the like) is improved compared to the case where the joining portion includes a resin bonding layer.

Furthermore, the rear surface 240b of the insulating ring 240 and the step surface 233 of the cooling substrate 230 are bonded to each other by the ring-shaped resin bonding layer 245. Thus, a route through which the atmosphere of the semiconductor manufacturing process unintentionally flows to the plate-shaped resin bonding layer 234 is blocked. This improves the durability of the plate-shaped resin bonding layer 234. Even when a gap is formed due to degradation and loss of the ring-shaped resin bonding layer 245 caused by use of the member for a semiconductor manufacturing apparatus 210 for a long time, variation of the amount of heat lost in this portion over time is small because the insulating ring 240 is joined to the plate 212 with the first joining layer 244 interposed therebetween. Thus, the uniformity of the wafer in temperature is not significantly affected. Furthermore, the original performance can be obtained by refilling the gap with the resin bonding agent.

Furthermore, the plate 212 and the insulating ring 240 are joined to each other by using the joining-material paste containing the alumina powder and the sintering agent. Thus, the plate 212 and the insulating ring 240 can be joined without largely increasing the pressure or the temperature. Furthermore, the sintering agent is contained in the interface between the plate 212 and the first joining layer 244 and the interface between the insulating ring 240 and the first joining layer 244. Preferably, the sintering agent is magnesium fluoride ($MgF_2$). The reason for this is that the volume resistivity and the withstand voltage of $MgF_2$ are less likely to reduce than those of another sintering agent (for example, CaO or the like).

Third Embodiment

Figure 7:
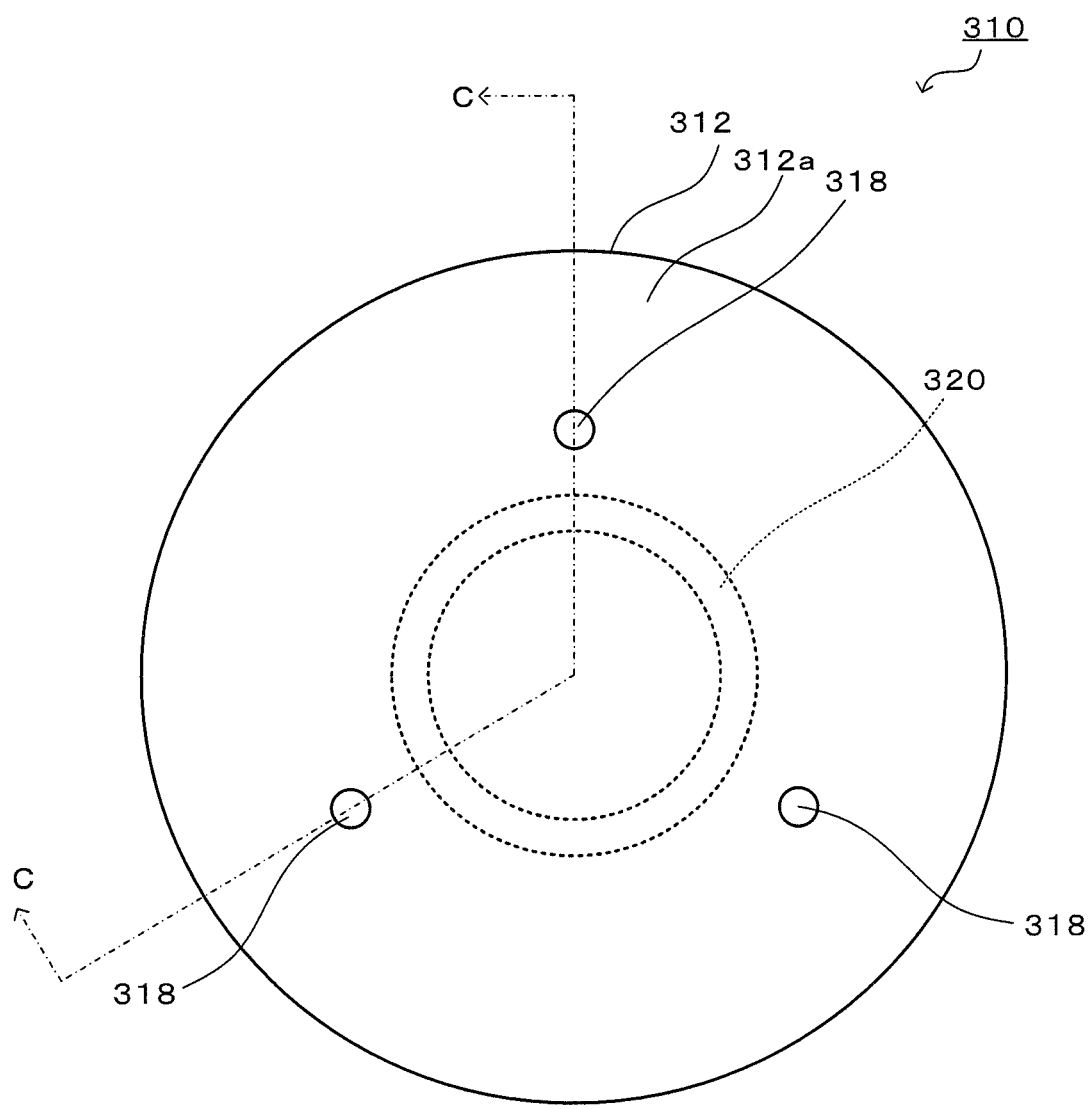
FIG. 7 is a plan view of a member for a semiconductor manufacturing apparatus 310.
Figure 8:
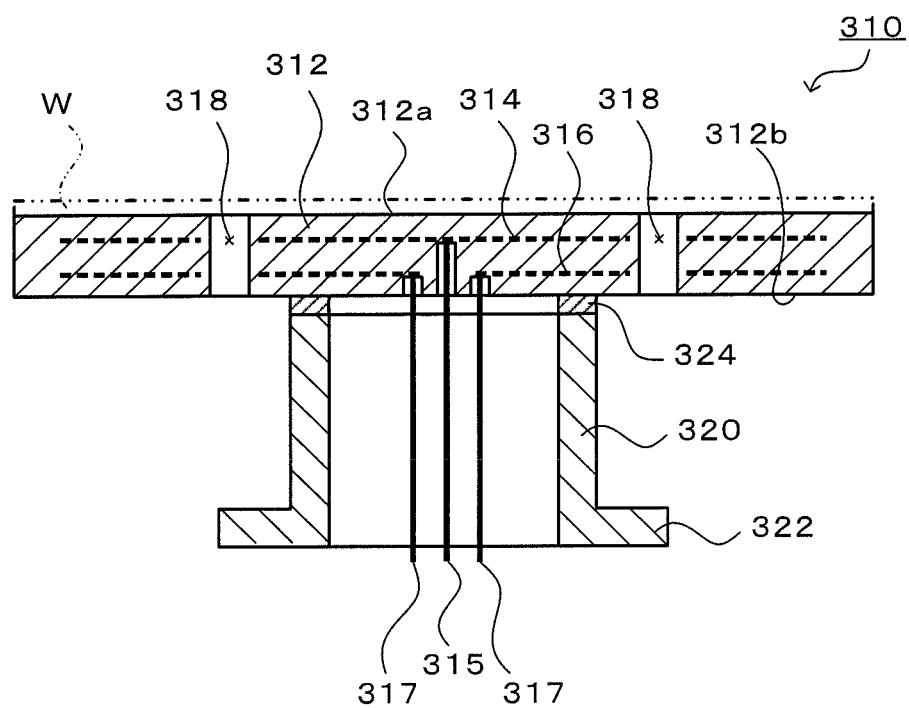
FIG. 8 is a sectional view of FIG. 7 taken along line C-C.

FIG. 7 is a plan view of a member for a semiconductor manufacturing apparatus 310, and FIG. 8 is a sectional view of FIG. 7 taken along line C-C. The member for a semiconductor manufacturing apparatus 310 includes a plate 312 and a hollow shaft 320 serving as a cylindrical member.

The plate 312 is a circular plate (for example, having a diameter of 300 mm) formed of an alumina sintered body. A front surface of the plate 312 serves as a wafer placement surface 312a. The plate 312 includes an electrostatic electrode 314 and a heater electrode 316 therein. The plate 312 has a plurality of through holes 318 penetrating through the plate 312 in the thickness direction. Since the electrostatic electrode 314 and the heater electrode 316 are the same as the electrostatic electrode 14 and the heater electrode 16 according to the first embodiment, description of the electrostatic electrode 314 and the heater electrode 316 is omitted herein.

The shaft 320 is a cylinder formed of an alumina sintered body and has an outer diameter smaller than an outer diameter of the plate 312. When the member for a semiconductor manufacturing apparatus 310 is seen in plan view, the shaft 320 and the plate 312 are concentric. The shaft 320 is joined to a rear surface 312b of the plate 312 with a first joining layer 324 formed of an alumina sintered body interposed therebetween. The first joining layer 324 has a ring shape. All of the plurality of through holes 318 are provided in a region further to an outer circumferential side than the shaft 320 in the plate 312. The through holes 318 are used as, for example, the lift-pin holes. A metal terminal 315 for supplying the power to the electrostatic electrode 314 and a pair of metal terminals 317 for supplying the power to the heater electrode 316 are disposed in the shaft 320. A flange 322 is provided at a lower end of the shaft 320.

Next, an example of the manufacture of the member for a semiconductor manufacturing apparatus 310 is described. First, the plate 312 is prepared. The plate 312 has the through holes 318. In addition, part of the electrostatic electrode 314 and parts of the heater electrodes 316 are exposed from the rear surface 312b of the plate 312. Next, the shaft 320 is prepared, and the joining-material paste similar to that according to the first embodiment is applied to a front surface of the shaft 320. Then, the plate 312 is placed on the front surface of the shaft 320 to which the joining-material paste is applied, and the shaft 320 and the plate 312 are heated while pressure is applied to the shaft 320 and the plate 312, thereby the joining material is sintered. Thus, the shaft 320 and the plate 312 are joined to each other. The joining material is sintered and becomes the first joining layer 324. At this time, since the joining-material paste contains the sintering agent (for example, $MgF_2$), the joining can be achieved without largely increasing the pressure or the temperature. Furthermore, a sintering agent component is contained in an interface between the plate 312 and the first joining layer 324 and an interface between the shaft 320 and the first joining layer 324. Next, the metal terminal 315 for supplying the power to the electrostatic electrode 314 is attached to the electrostatic electrode 314 from the rear surface 312b of the plate 312, and the metal terminals 317 for supplying the power to the heater electrode 316 are attached to the heater electrode 316 from the rear surface 312b of the plate 312. Thus, the member for a semiconductor manufacturing apparatus 310 is obtained.

In the member for a semiconductor manufacturing apparatus 310 having been described in detail, the shaft 320 formed of the alumina sintered body is joined to the rear surface 312b of the plate 312 formed of the alumina sintered body with the first joining layer 324 having a ring shape and formed of the alumina sintered body interposed therebetween. That is, a joining portion between the plate 312 and the shaft 320 is the alumina sintered body. Accordingly, corrosion resistance of the joining portion between the plate 312 and the shaft 320 for the atmosphere of the semiconductor manufacturing process (for example, plasma or the like) is improved compared to the case where the joining portion includes a resin bonding layer.

Furthermore, the metal terminal 315 for supplying the power to the electrostatic electrode 314 and the metal terminals 317 for supplying the power to the heater electrode 316 are disposed in the shaft 320. Thus, when the inside of the shaft 320 is cut off from the atmosphere of the semiconductor manufacturing process (such as plasma), the metal terminals 315, 317 can be protected from such an atmosphere.

Other Embodiments

The present invention is not limited to the above-described embodiments, and can be carried out by various modes as long as they belong to the technical scope of the invention.

For example, according to the first embodiment described above, the example is described in which, as the example of the manufacture of the member for a semiconductor manufacturing apparatus 10, as illustrated in FIGS. 3A and 3B, the assembly 76 is manufactured first, and then, the holes penetrating from the plate 62 to the insulating columns 70 are provided by using the drilling tool, thereby obtaining the assembly 78. However, this is not limiting. For example, the member for a semiconductor manufacturing apparatus 10 may be manufactured by preparing the plate 12 having the through holes 18 and the insulating pipes 20 and joining the plate 12 and the insulating pipes 20 by using the joining-material paste similar to that according to the first embodiment. In this case, it is likely that a step is formed between the inner surface 18a of each of the through hole 18 and the ring inner surface 24a of a corresponding one of the first joining layers 24 or between the ring inner surface 24a of the first joining layer 24 and the inner surface 20a of a corresponding one of the insulating pipes 20. Thus, when the through hole 18 and the insulating pipe 20 are used as the lift-pin hole, the lift pin may be caught by such a step, and accordingly, the lift pin is not necessarily smoothly moved. In this regard, it is preferable that the manufacturing steps illustrated in FIGS. 3A and 3B be employed.

Although the gap c is formed between each of the wall surface 32a surrounding a corresponding one of the cylindrical spaces 32 and the outer surface of a corresponding one of the insulating pipes 20 according to the first embodiment, the gap c may be filled with a resin bonding agent.

Although the ring-shaped resin bonding layer 245 is provided between the rear surface 240b of the insulating ring 240 and the step surface 233 of the cooling substrate 230 according to the second embodiment described above, a gap may be formed between the rear surface 240b of the insulating ring 240 and the step surface 233 of the cooling substrate 230 without filling the ring-shaped resin bonding layer 245. Even in this case, since the insulating ring 240 functions as a wall surrounding the outer circumference of the plate 212, the likelihood of unintentional flowing of the atmosphere of the semiconductor manufacturing process to the plate-shaped resin bonding layer 234 is reduced. This improves the durability of the plate-shaped resin bonding layer 234.

Figure 9:
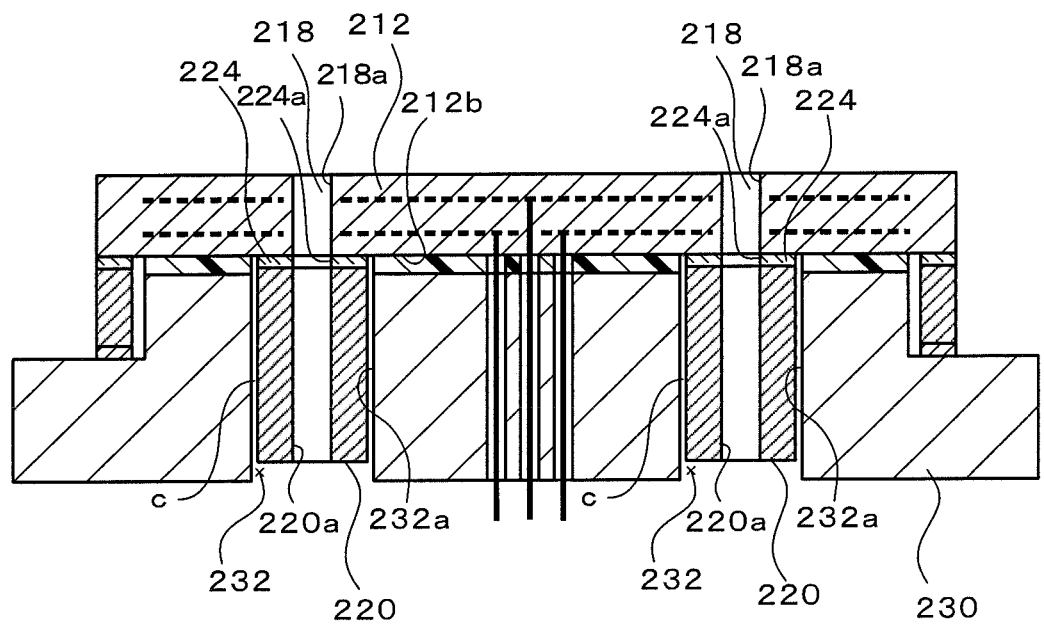
FIG. 9 is a sectional view of the member for a semiconductor manufacturing apparatus 210 according to another embodiment.

Although the insulating pipes 220 are bonded to the rear surface 212b of the plate 212 with the cylindrical resin bonding layers 235 interposed therebetween and bonded to the wall surfaces 232a surrounding the cylindrical spaces 232 of the cooling substrate 230 with the cylindrical resin bonding layers 235 interposed therebetween according to the second embodiment described above, this is not limiting. For example, as illustrated in FIG. 9, as is the case with the insulating pipes 20 according to the first embodiment described above, the insulating pipes 220 may be joined to the rear surface 212b of the plate 212 with joining layers (second joining layers) 224 formed of an alumina sintered body interposed therebetween. In this way, corrosion resistance of the joining portions between the plate 212 and the insulating pipes 220 for the atmosphere in the semiconductor manufacturing process (for example, plasma or the like) is improved compared to the case where the joining portions include a resin bonding layer. Furthermore, the gap c is formed between each of the wall surfaces 232a surrounding a corresponding one of the cylindrical spaces 232 and the outer surface of a corresponding one of the insulating pipes 220. Thus, compared to the case where the wall surface 232a and the outer surface of the insulating pipe 220 are bonded to each other, need for consider heat transfer between the insulating pipe 220 and the cooling substrate 230 is eliminated. This facilitates the design of temperature control for the wafer W. Furthermore, it is preferable that an inner surface 218a of each of the through holes 218, an inner surface 224a of a corresponding one of the joining layers 224, and an inner surface 220a of a corresponding one of the insulating pipes 220 be continuous with one another without a step. Particularly, in the case where the insulating pipes 220 and the through holes 218 are used as the lift-pin holes, when a step is formed, the lift pin may be caught by the step, and accordingly, the lift pin is not necessarily smoothly moved. However, since such a step is not formed, the lift pin can be smoothly moved. Furthermore, a sintering agent component (for example, $MgF_2$) may be contained in interfaces between the plate 212 and the joining layers 224 and interfaces between the insulating pipes 220 and the joining layers 224. In this case, when the plate 212 and the insulating pipes 220 are joined to one another by using an alumina-containing joining material containing the sintering agent, the plate 212 and the insulating pipes 220 can be joined without largely increasing the pressure or the temperature.

According to the above-described embodiments, as an example of the plate 12, 212, 312, an electrostatic chuck heater including therein both the electrostatic electrode 14, 214, 314 and the heater electrode 16, 216, 316 is described. However, this is not particularly limiting. For example, the plate 12, 212, 312 may be an electrostatic chuck including therein only the electrostatic electrode 14, 214, 314 or a ceramic heater including therein only the heater electrode 16, 216, 316.

Although the number of the through holes 18 of the plate 12, 212, 312 is three according to the above-described embodiments, the number of the through holes 18 may be four or more.

EXAMPLES

In experimental examples 1, 2 described in Table 1, a joined body of alumina sintered bodies was obtained by applying alumina powder and a joining-material paste containing $MgF_2$ as the sintering agent between an alumina sintered body A and an alumina sintered body B and sintering the joining material through application of heat and pressure. In experimental examples 3, 4, joining of two alumina sintered bodies A, B was attempted by applying heat and pressure without using the joining-material paste. However, the alumina sintered bodies A, B were not joined in either of the examples. The alumina sintered body A of experimental examples 1 to 4 and the alumina sintered body B of experimental examples 1, 3 can be produced with reference to, for example, Japanese Unexamined Patent Application Publication No. 5-9064. The alumina sintered body B of experimental examples 2, 4 can be produced with reference to experimental example 1 of Japanese Unexamined Patent Application Publication No. 2016-183067.

The strength and airtightness of the obtained joined bodies were evaluated. The results are described in Table 1. Regarding the strength, the four-point bending strength of a flexural rod was measured at room temperature in accordance with JIS 1601. The flexural rod in use is a joined body (4×3×40 mm) formed by joining a first alumina sintered body A having a size of 4×3×20 mm and a second alumina sintered body B having the same size as the size of the first alumina sintered body A. Regarding the airtightness, the airtightness of joined surfaces was measured as follows: joined bodies were produced. Each of the joined bodies was formed by joining a circular-plate shaped alumina sintered body A and an alumina sintered body B that is a hollow shaft having the same diameter as the diameter of the alumina sintered body A; and, by employing a hood method and using a helium leak detector (MSE-2000, made by SHIMADZU CORPORATION), the outside of the shaft was set in a helium gas atmosphere while the inside of the shaft was evacuated. From the results, it is understood that the strength and airtightness of the joined bodies in experimental examples 1, 2 are sufficiently high.

TABLE 1

| | | Experimental example 1 | Experimental example 2 | Experimental example 3 | Experimental example 4 |
|---|---|---|---|---|---|
| Alumina sintered body A | | Raw material: High purity alumina (purity of 99.9% or more) | Raw material: High purity alumina (purity of 99.9% or more) | Raw material: High purity alumina (purity of 99.9% or more) | Raw material: High purity alumina (purity of 99.9% or more) |
| Alumina sintered body B | | Raw material: High purity alumina (purity of 99.9% or more) | Raw material: High purity alumina containing MgO and $MgF_2$ (purity of 99.9% or more) | Raw material: High purity alumina (purity of 99.9% or more) | Raw material: High purity alumina containing MgO and $MgF_2$ (purity of 99.9% or more) |
| Joining material | Used or not | Used | Used | Not used | Not used |
| | $MgF_2$ content *[1] | 10% by mass | 10% by mass | — | — |
| Sintering condition | Pressure | 0.5 kgf/cm$^2$ | 0.5 kgf/cm$^2$ | 0.5 kgf/cm$^2$ | 0.5 kgf/cm$^2$ |
| | Temperature | 1100° C. | 1100° C. | 1100° C. | 1100° C. |
| Characteristic of joined body | Strength | >300 MPa | >300 MPa | Cannot be measured because alumina sintered bodies were not joined | Cannot be measured because alumina sintered bodies were not joined |
| | Airtightness | <5E−10 Pa · m$^3$/sec | <5E−10 Pa · m$^3$/sec | | |

*[1] The $MgF_2$ content is calculated as follows: 100 * (mass of $MgF_2$)/(mass of $MgF_2$ + mass of $Al_2O_3$).

Content described in a United States provisional application on the basis of which the priority of the present application is claimed is described as follows. These are supported by the present description.

[1] A method of manufacturing an alumina-sintered-body-and-alumina-sintered-body joined body includes the step of (a) preparing a first alumina sintered body, a second alumina sintered body, and an alumina-containing joining agent such that at least one of the first alumina sintered body, the second alumina sintered body, and the alumina-containing joining agent contains $MgF_2$ and producing a multilayer body in which the alumina-containing joining agent is interposed between the first alumina sintered body and the second alumina sintered body. The method also includes the step of (b) obtaining the alumina-sintered-body-and-alumina-sintered-body joined body by sintering the multilayer body while a load is applied to the multilayer body.

[2] The method of manufacturing the alumina-sintered-body-and-alumina-sintered-body joined body according to [1] described above in which the alumina-containing joining agent contains $MgF_2$.

[3] An alumina-sintered-body-and-alumina-sintered-body joined body is an alumina-sintered-body-and-alumina-sintered-body joined body formed by joining a first alumina sintered body and a second alumina sintered body to each other with an alumina-containing joining layer interposed therebetween. An interface between the first alumina sintered body and the alumina-containing joining layer and an interface between the second alumina sintered body and the alumina-containing joining layer contain $MgF_2$.

[4] A member for a semiconductor manufacturing apparatus includes an alumina circular plate, a through hole, and an alumina insulating cylinder. The alumina circular plate has a wafer placement surface and includes therein an electrode. The through hole penetrates through the alumina circular plate in an up-down direction. The alumina insulating cylinder is joined to a rear surface of the alumina circular plate, such that alumina insulating cylinder communicates with the through hole, with an alumina-containing joining layer interposed therebetween. In the member for a semiconductor manufacturing apparatus, an interface between the alumina circular plate and the alumina-containing joining layer and an interface between the alumina insulating cylinder and the alumina-containing joining layer contain $MgF_2$.

[5] A member for a semiconductor manufacturing apparatus includes an alumina circular plate and an alumina cylinder. The alumina circular plate has a wafer placement surface and includes therein an electrode. The alumina cylinder is joined to a rear surface of the alumina circular plate with an alumina-containing joining layer interposed therebetween. The alumina cylinder is coaxial with the alumina circular plate. In the member for a semiconductor manufacturing apparatus, an interface between the alumina circular plate and the alumina-containing joining layer and an interface between the alumina cylinder and the alumina-containing joining layer contain $MgF_2$.

[6] The member for a semiconductor manufacturing apparatus according to [4] or [5] described above is an electrostatic chuck heater, an electrostatic chuck, or a ceramic heater.

What is claimed is:

1. A member for a semiconductor manufacturing apparatus, the member comprising:
    a plate that is formed of an alumina sintered body, that has a front surface serving as a wafer placement surface, and that includes therein an electrode;
    at least one through hole that penetrates through the plate in a thickness direction; and
    a cylindrical member that is formed of an alumina sintered body and that is joined to a rear surface of the plate with a first joining layer having a ring shape and formed of an alumina sintered body interposed between the cylindrical member and the rear surface of the plate;
    wherein a first sintered interface formed between the plate and the first joining layer and a second sintered interface formed between the cylindrical member and the first joining layer contain $MgF_2$.

2. The member for a semiconductor manufacturing apparatus according to claim 1,
    wherein the cylindrical member is provided for a corresponding each of the at least one through hole, and an inside of the cylindrical member communicates with the corresponding through hole.

3. The member for a semiconductor manufacturing apparatus according to claim 2,
    wherein an inner surface of the through hole, a ring inner surface of the first joining layer, and an inner surface of the cylindrical member are continuous with one another without a step.

4. The member for a semiconductor manufacturing apparatus according to claim 2, further comprising:
    a cooling substrate which is formed of metal and which is bonded to or joined to the rear surface of the plate; and
    a cylindrical space which penetrates through the cooling substrate in the thickness direction and in which the cylindrical member is disposed.

5. The member for a semiconductor manufacturing apparatus according to claim 4,
    wherein a gap is formed between a wall surface surrounding the cylindrical space and an outer surface of the cylindrical member.

6. The member for a semiconductor manufacturing apparatus according to claim 1,
    wherein an outer diameter of the cylindrical member is smaller than an outer diameter of the plate, and wherein all of the at least one through hole is provided in a region further to an outer circumferential side than the at least one cylindrical member on the plate.

7. The member for a semiconductor manufacturing apparatus according to claim 1,
    wherein an outer diameter of the cylindrical member is coincident with an outer diameter of the plate, and wherein all of the at least one through hole is provided in a region further to an inner circumferential side than the at least one cylindrical member on the plate.

8. The member for a semiconductor manufacturing apparatus according to claim 7, further comprising:
    a stepped cooling substrate that is formed of metal and that has lamination shape formed of a small plate portion having an outer diameter smaller than an inner diameter of the cylindrical member and a large plate portion having an outer diameter larger than the outer diameter of the cylindrical member,
    wherein the rear surface of the plate is bonded to or joined to a front surface of the small plate portion of the cooling substrate, and wherein a rear surface of the cylindrical member is bonded to a step surface of the cooling substrate or spaced from the step surface of the cooling substrate with a gap between the rear surface of the cylindrical member and the step surface of the cooling substrate.

9. The member for a semiconductor manufacturing apparatus according to claim 8, further comprising:
   a insulating pipe which is formed of an alumina sintered body, which is provided for a corresponding each of the at least one through hole, and which is joined to the rear surface of the plate, such that the insulating pipe communicates with the corresponding through hole, with a second joining layer having a ring shape and formed of an alumina sintered body interposed between the insulating pipe and the rear surface of the plate; and
   a cylindrical space which penetrate through the cooling substrate in the thickness direction and in which the insulating pipe is disposed.

10. The member for a semiconductor manufacturing apparatus according to claim 9,
    wherein a gap is formed between a wall surface surrounding the cylindrical space and an outer surface of the insulating pipe.

11. The member for a semiconductor manufacturing apparatus according to claim 9,
    wherein an inner surface of the at least one through hole, a ring inner surface of the second joining layer, and an inner surface of the insulating pipe are continuous with one another without a step.

12. The member for a semiconductor manufacturing apparatus according to claim 9,
    wherein an interface between the plate and the second joining layer and an interface between the insulating pipe and the second joining layer contain $MgF_2$.

13. The member for a semiconductor manufacturing apparatus according to claim 1,
    wherein the plate is an electrostatic chuck heater, an electrostatic chuck, or a ceramic heater.

* * * * *